United States Patent [19]
Kojima

[11] Patent Number: 5,485,108
[45] Date of Patent: Jan. 16, 1996

[54] DELAYED DETECTION TYPE DEMODULATOR

[75] Inventor: Toshiharu Kojima, Kamakura, Japan

[73] Assignee: Mitsubishi Denki Kabushiki Kaisha, Tokyo, Japan

[21] Appl. No.: 218,977

[22] Filed: Mar. 28, 1994

Related U.S. Application Data

[62] Division of Ser. No. 997,768, Dec. 24, 1992, Pat. No. 5,313,170.

[30] Foreign Application Priority Data

Dec. 27, 1991 [JP] Japan ................. 3-347245

[51] Int. Cl.⁶ ........................ G01R 25/00; H04L 27/22
[52] U.S. Cl. .................. 327/8; 327/236; 327/241; 327/248
[58] Field of Search .......................... 328/155, 133; 302/269, 262, 511, 443; 375/94, 80, 82

[56] References Cited

U.S. PATENT DOCUMENTS 5,272,447  12/1993  Furuya et al. ............. 375/80

FOREIGN PATENT DOCUMENTS 008491   3/1980   European Pat. Off. .
2644952  3/1989   France .

Primary Examiner—Timothy P. Callahan
Assistant Examiner—Dinh Le
Attorney, Agent, or Firm—Wolf, Greenfield & Sacks

[57] ABSTRACT

Within the differential detection demodulator, the received signal is first quantized by a limiter amplifier 10 and then subjected to frequency conversion by a frequency converter 50 including: an exclusive OR element 51; a running average generator 52 consisting of a shift register 53 and an adder 54; and a comparator 55. In response to the output of the frequency converter 50, the phase comparator 60 outputs a relative phase signal representing the phase shift of the received signal after frequency conversion relative to the phase reference signal. The phase comparator 60 includes: an exclusive OR element 61; an absolute phase shift measurement means 62 consisting of an adder 63 and D flip-flop arrays 64 and 65; and a D flip-flop 66 serving as a phase shift polarity decision means. Alternatively, the phase detection circuit 400 for generating the relative phase signal may include: a half-period detection means 901 consisting of a delay element 401 and an exclusive OR element 402; a phase reference signal generation means 902 consisting of a modulo 2N counter 403; and a phase shift measurement means 903 consisting of a phase inversion corrector 500 and a D flip-flop array 404. The delay element 40 delays the relative phase signal by one symbol period and the subtractor 41 outputs the phase difference signal representing the phase transition over each symbol period of the received signal. The decision circuit 42 obtains the demodulated data from the phase difference signal.

7 Claims, 13 Drawing Sheets

FIG. I
(PRIOR ART)

DELAYED DETECTION TYPE DEMODULATOR

This application is a division of application Ser. No. 07/997,768, filed Dec. 24, 1992 now U.S. Pat. No. 5,313,170.

BACKGROUND OF THE INVENTION

This invention relates to differential detection demodulators used in the radio communication systems, and more particularly to the improvements in the frequency converter and the phase comparator or the phase detection circuit used in the differential detection demodulators.

Referring to FIG. 1, a differential detection demodulator using a phase detection circuit is described. A digital differential detection demodulator using a phase detection circuit is disclosed, for example, in H. Tomita et al., "DIGITAL INTERMEDIATE FREQUENCY DEMODULATION TECHNIQUE", Paper B-299, 1990 Fall National Conference of the Institute of Electronics, Information and Communication Engineers of Japan. The differential detection demodulator is described by reference to drawings.

FIG. 1 is a block diagram showing the structure of a digital differential detection demodulator provided with a phase detection circuit. First, the received signal is supplied to a limiter amplifier 10. The output of the limiter amplifier 10 is coupled to a phase detection circuit 200 including: a counter 201 counting in modulo K, where K is a positive integer; and a D flip-flop array 202. The output of the phase detection circuit 200 is coupled to: a delay element 40 having a delay time equal to the one symbol period of the received signal; and a subtractor 41 effecting subtraction in modulo $2\pi$.

Next the operation of the circuit of FIG. 1 is described. The received signal, which is a differential phase shift keying (DPSK) signal, is shaped by the limiter amplifier 10 into a rectangular waveform of constant amplitude. Namely, the limiter amplifier 10 acts as a quantizer for effecting 2-level quantization upon the received signal. Thus, the received signal is quantized by the limiter amplifier 10 into a 2-level signal taking the value either at the logical "0" or logical "1".

The counter 201 of modulo K within the phase detection circuit 200 is supplied by a clock signal having a frequency practically equal to K times the frequency of the received signal. The output of the counter 201 is supplied to the D flip-flop array 202, which is driven by the 2-level quantized received signal output from the limiter amplifier 10. The output of the phase detection circuit 200 represents the relative phase of the 2-level quantized received signal with respect to a virtual phase reference signal.

Next this is described by reference to waveform diagrams. FIGS. 2 and 3 are timing charts showing the waveforms exemplifying the operation of the phase detection circuit 200, where K=16. In FIG. 2 are shown, from top to bottom, the waveforms of: the clock supplied to the counter 201; the output of the counter 201; the virtual phase reference signal, which is obtained by dividing the clock of the counter 201 by K (equal to 16 in this case); the 2-level quantized received signal; and the output of the D flip-flop array 202. From top to bottom in FIG. 3 are shown the waveforms of: the clock for the counter 201; the output of the counter 201; the virtual phase reference signal; the 2-level quantized received signal A, the phase of which is increasingly lagged; output A of D flip-flop array 202 corresponding to the 2-level quantized received signal A; the 2-level quantized received signal B, the phase of which is increasingly led; and the output B of the D flip-flop array 202 corresponding to the 2-level quantized received signal B.

The virtual phase reference signal rises to logical "1" at the instant when the output of the counter 201 is reset to logical "0", and falls to logical "0" at the instant when the output of the counter 201 reaches K/2 (equal to 8 in this case). If the period of the clock of the counter 201 is represented by T and that of the virtual phase reference signal $T_r$, then:

$$T_r = KT$$

Thus, if the length of time between the rising edges of the virtual phase reference signal and the 2-level quantized received signal is represented by $\tau$, then the phase shift $\psi$ of the 2-level quantized received signal relative to the virtual phase reference signal is given by:

$$\psi = 2\pi\sigma/T_r = 2\pi\tau/(K\,T)$$

On the other hand, as seen from FIG. 2, the output of the counter 201 at the rising edge of the 2-level quantized received signal is equal to an integer obtained by dividing the time $\tau$ by the period T of the clock of the counter 201 and then discarding the fractional parts of the quotient.

The D flip-flop array 202 is driven at each rising edge of the 2-level quantized received signal to hold the output of the counter 201. Thus, the output of the D flip-flop array 202 is equal to the integer obtained by dividing the shift time $\tau$ by the period T of the clock of the counter 201 and then discarding the fractional parts of the quotient resulting from the division. Namely, if the output of the D flip-flop array 202 is represented by $\mu$, where $\mu \in \{0, 1, \ldots, K-1\}$, then the following relation holds among $\mu$, T and $\tau$:

$$\mu \leq \tau/T < (\mu+1)$$

Thus, the following relation holds between the phase shift $\psi$ of the 2-level quantized received signal relative to the virtual phase reference signal and the output $\mu$ of the D flip-flop array 202:

$$2\pi\mu/K \leq \psi < 2\pi(\mu+1)/K$$

This relation shows that the output of the D flip-flop array 202 can be regarded as the relative phase of the 2-level quantized received signal with respect to the virtual phase reference signal.

FIG. 2 shows the case where the relative phase of the 2-level quantized received signal with respect to the virtual phase reference signal is constant. Thus, the output of the D flip-flop array 202 remains at eight (8). On the other hand, FIG. 3 shows the case where the relative phase signal of the 2-level quantized received signal A is increasingly lagged and the relative phase of the 2-level quantized received signal B is increasingly led. Thus, upon receiving the 2-level quantized received signal A, the output A of the D flip-flop array 202 increases from seven (7) to nine (9). On the other hand, upon receiving the 2-level quantized received signal B, the output B of the D flip-flop array 202 decreases from nine (9) to seven (7). In either case, the output of the D flip-flop array 202 varies in proportion to the variation of the relative phase of the 2-level quantized received signal with respect to the virtual phase reference signal.

The phase detection circuit of FIG. 1 has the following disadvantage. The D flip-flop array 202 is driven only at the rising edges of the 2-level quantized received signal. Thus, the relative phase signal output from the phase detection circuit is updated only at each full period of the 2-level quantized received signal. In principle, however, the value of the relative phase of the 2-level quantized received signal can be updated two times for each period of the 2-level quantized received signal. Namely, the phase detection circuit of FIG. 1 has the disadvantage that the rate at which the relative phase signal is updated is low.

Next, a differential detection demodulator provided with a phase detection circuit which solves this problem of the circuit of FIG. 1 is described.

SUMMARY OF THE INVENTION

It is therefore an object of this invention to provide a differential detection demodulator provided with a frequency converter and a phase comparator consisting of digital circuit elements, such that the circuit can easily be integrated into ICs and hence the adjustment of the circuits can be dispensed with and the size and the power consumption can be reduced.

The phase detection circuit according to this invention for detecting a phase shift of an input signal relative to a phase reference signal, comprises: half-period detector means for generating, in response to the input signal, a half-period detection signal at each half-period of the input signal; phase reference signal generator means for generating the phase reference signal in response to a clock signal having a frequency not less than twice a frequency of the input signal; and phase shift determiner means, coupled to the half-period detector means and phase reference signal generator means and including phase inversion corrector means for correcting the phase reference signal for a phase inversion thereof at each alternate half-period of the input signal, the phase shift determiner means determining and outputting a phase shift of the input signal with respect to the phase reference signal at each half-period of the input signal, on the basis of the phase reference signal corrected by the phase inversion corrector means and the half-period detection signal output from the half-period detector means.

Preferably, the half-period detector means includes: a delay element for delaying the input signal by a delay time shorter than the half-period of the input signal; and a first exclusive OR element for generating a logical exclusive OR of the input signal and an output of the delay element; the phase reference signal generator means includes a counter for counting in modulo 2N a clock signal having a frequency practically equal to 2N times the frequency of the input signal, where N is a positive integer; the phase inversion corrector means adds a numerical value "0" or "N" in modulo 2N to an output of the counter in response to the output of the delay element in the half-period detector means; and the phase shift determiner means includes, in addition to the phase inversion corrector means, a D flip-flop array coupled to the phase inversion corrector means and the exclusive OR element in the half-period detector means the D flip-flop array holding an output of the phase inversion corrector means in response to the logical exclusive OR output of the exclusive OR element, wherein a value held in the D flip-flop array constitutes an output of the phase shift determiner means.

Further, the phase inversion corrector means may include: a multiplier coupled to the delay element, for multiplying the output of the delay element by N; and an adder coupled to the counter and the multiplier, for adding an output of the multiplier to the output of the counter in modulo 2N.

Alternatively, the phase inversion corrector means may include: a data selector coupled to the delay element, for selecting a numerical value "0" when the output of the delay element is at logical "0", and a numerical value "1" when the output of the delay element is at logical "1" and an adder coupled to the counter and the data selector, for adding an output of the data selector to the output of the counter in modulo 2N.

Still alternatively, the phase inversion corrector means may include: logical product elements coupled to the delay element, for generating logical products of the output of the delay element and respective bits of a numerical value "N"; and an adder coupled to the counter and the logical product elements, for adding outputs of the logical product elements with the output of the counter in modulo 2N.

Preferably, the counter counts a clock signal having a frequency practically equal to $2^M$ times the frequency of the input signal, where M is a positive integer; and the phase inversion corrector means includes a second exclusive OR element coupled to the output of the delay element in the half-period detector means and a most significant bit of the output of the counter, the second exclusive OR element generating a logical exclusive OR of the output of the delay element and the most significant bit of the output of the counter, wherein an output of the phase inversion corrector means consists of a combination of least significant bits of the output of the modulo 2N counter and the logical exclusive OR output of the second exclusive OR element.

The method according to this invention for detecting a phase shift of an input signal relative to a phase reference signal, comprises the steps of: generating, in response to the input signal, a half-period detection signal at each half-period of the input signal; generating the phase reference signal in response to a clock signal having a frequency not less than twice a frequency of the input signal; correcting the phase reference signal for a phase inversion thereof at each alternate half-period of the input signal; and determining a phase shift of the input signal with respect to the phase reference signal at each half-period of the input signal, on the basis of the corrected phase reference signal and the half-period detection signal.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

DETAILED DESCRIPTION OF THE PREFERRED EMBODIMENTS

Referring now to the accompanying drawings, the preferred embodiments of this invention are described.

Figure 4:
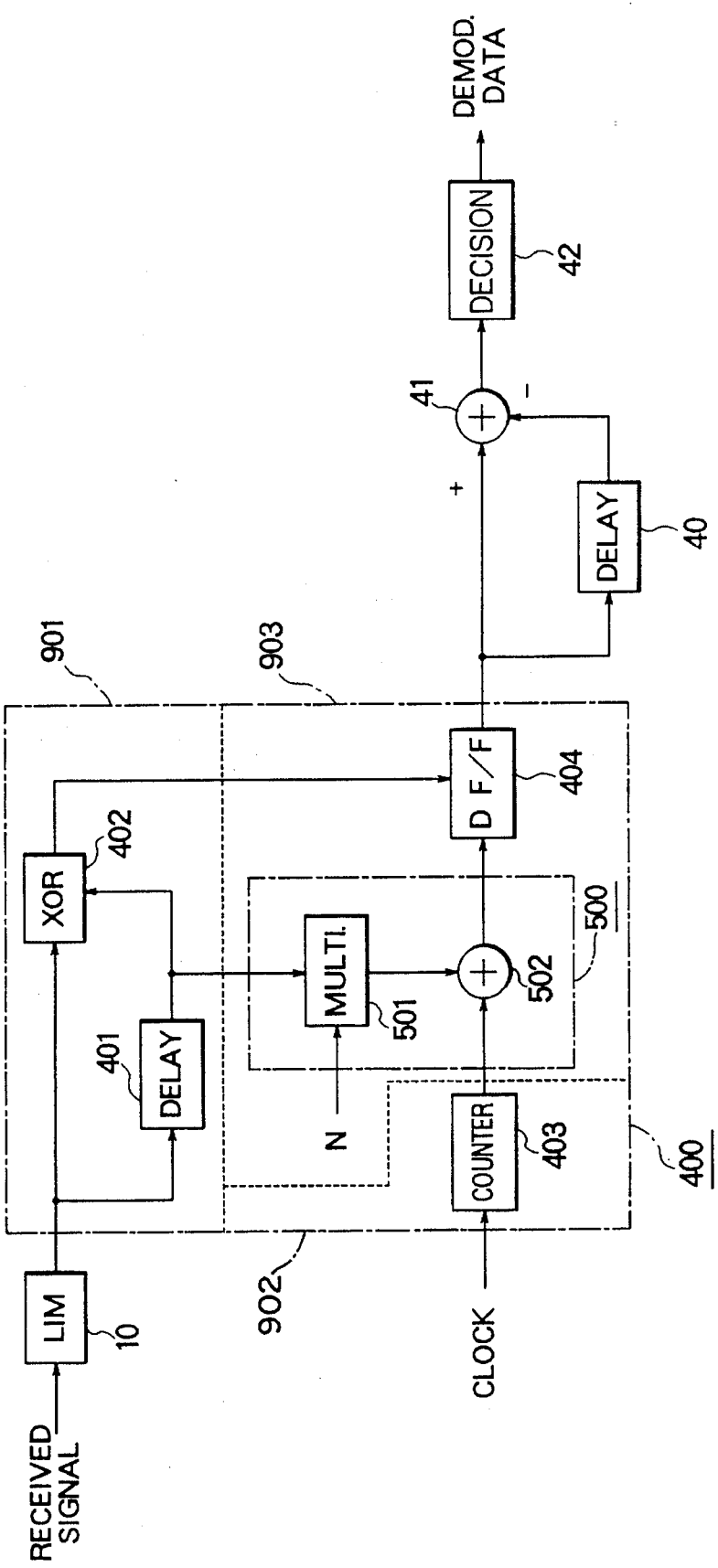
FIG. 4 is a block diagram of a differential detection demodulator provided with a phase detection circuit according to this invention, by which the value of the relative phase of the 2-level quantized received signal with respect to the virtual phase reference signal can be updated two times for each period of the 2-level quantized received signal.

FIG. 4 is a block diagram of a differential detection demodulator provided with a phase detection circuit according to this invention, by which the value of the relative phase of the 2-level quantized received signal with respect to the virtual phase reference signal can be updated two times for each period of the 2-level quantized received signal. The output of limiter amplifier 10 is coupled to a phase detection circuit 400 which includes: a delay element 401 and an exclusive OR element 402 coupled to the limiter amplifier 10; a modulo 2N counter 403 for counting in modulo 2N, where N is a positive integer; a D flip-flop array 404; and a phase inversion corrector 500. The phase inversion corrector 500 includes: a multiplier 501 and an adder 502 for effecting addition in modulo 2N.

Functionally, the phase detection circuit 400 is divided into a half-period detection means 901, a phase reference signal generation means 902 and a phase shift measurement means 903. The half-period detection means 901 consists of the delay element 401 and the exclusive OR element 402. Upon receiving the 2-level quantized received signal from the limiter amplifier 10, the half-period detection means 901 outputs a half-period detection signal at each half-period of the received signal. The phase reference signal generation means 902 consists of the modulo 2N counter 403. On the basis of a clock signal having a frequency not less than twice the frequency of the two-level quantized received signal, the phase reference signal generation means 902 generates the phase reference signal serving as the reference for measuring the phase shift of the 2-level quantized received signal. A phase shift measurement means 903 consists of the D flip-flop array 404 and the phase inversion corrector 500. The phase inversion corrector 500 corrects the phase inversion of the phase reference signal at each half-period of the received signal. On the basis of the corrected phase reference signal and the half-period detection signal output from the half-period detection means 901, the phase shift measurement means 903 determines and outputs the phase shift of the 2-level quantized received signal relative to the phase reference signal at each half-period of the received signal.

Figure 9:
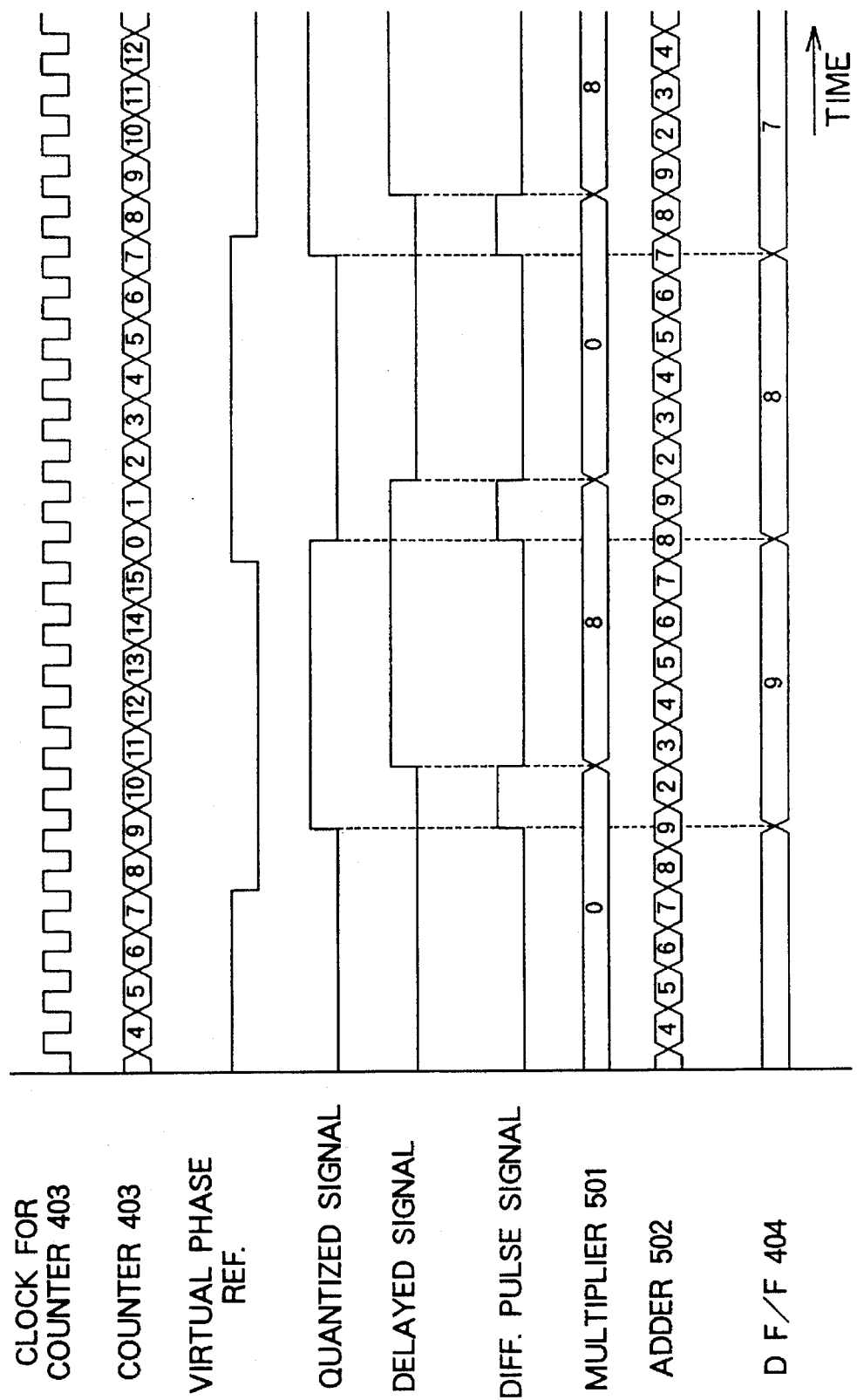
FIG. 9 is a view similar to that of FIG. 7, but showing the case where the relative phase of the two-value quantized received signal with respect to the virtual phase reference signal is increasingly led.

The delay element 40, subtractor 41, and the decision circuit 42 are similar to those described in FIG. 9.

Next, the operation of the circuit of FIG. 4 is described in detail. In FIG. 4, the limiter amplifier 10 shapes the received signal into a rectangular waveform of a constant amplitude. Namely, the limiter amplifier 10 acts as a 2-level quantizer for subjecting the received signal to the 2-level quantization, such that the output of the limiter amplifier 10 is quantized to logical "0" and "1".

The 2-level quantized received signal output from the limiter amplifier 10 is supplied to the phase detection circuit 400, where it is first input to the delay element 401 and exclusive OR element 402. The delay time of the delay element 401 is shorter than the half-period of the 2-level quantized received signal. The delayed received signal output from the delay element 401 is supplied to the exclusive OR element 402, together with the 2-level quantized received signal output from the limiter amplifier 10. The exclusive OR element 402 effects the logical exclusive OR operation upon the outputs of the limiter amplifier 10 and the delay element 401. Thus, the output of the exclusive OR element 402 is a pulse signal (referred to as the differential pulse signal) which rises (i.e., has rising edges) at the rising and the falling edges of the 2-level quantized received signal. Next, this is described by reference to drawings.

Figure 5:
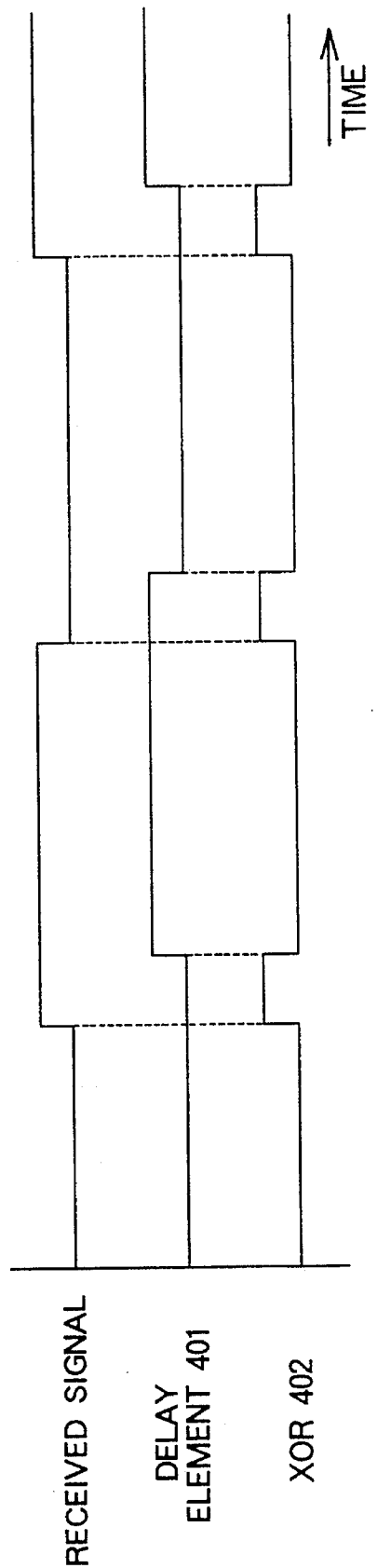
FIG. 5 is a timing chart showing waveforms exemplifying the operation of the delay element 401 and the exclusive OR element 402 of FIG. 4.

FIG. 5 is a timing chart showing waveforms exemplifying the operation of the delay element 401 and the exclusive OR element 402 of FIG. 4. From top to bottom in FIG. 5 are shown the waveforms of: the 2-level quantized received signal; the output of the delay element 401; and the output of the exclusive OR element 402 (the differential pulse signal). As shown in FIG. 5, the delay time of the delay element 401, namely the time length by which the 2-level quantized received signal is delayed, is shorter than the half-period of the 2-level quantized received signal. Thus, the differential pulse signal output from the exclusive OR element 402 rises (i.e., has the rising edges) at the rising and the falling edges of the 2-level quantized received signal.

Figure 1:
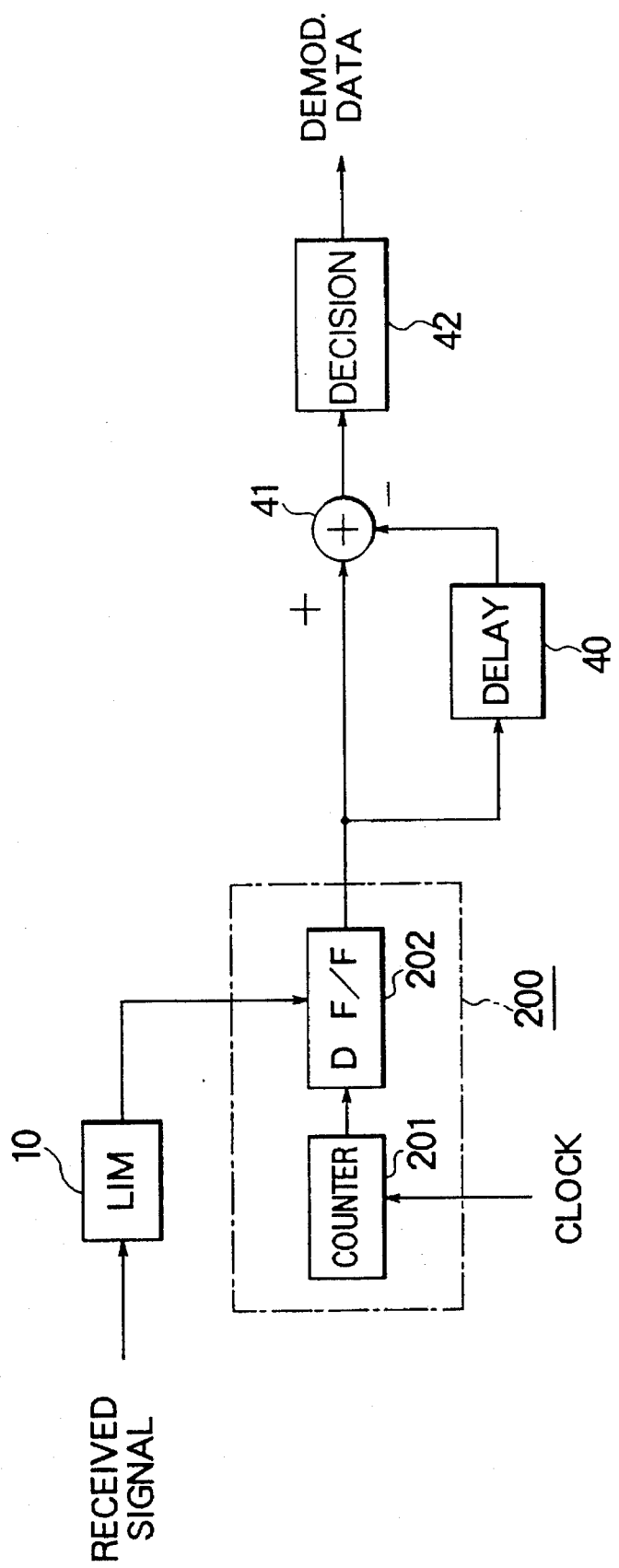
FIG. 1 is a block diagram showing the structure of a conventional digital differential detection demodulator provided with a phase detection circuit.

On the other hand, the modulo 2N counter 403 is driven by a clock signal having a frequency practically equal to 2N times the frequency of the 2-level quantized received signal. If a virtual phase reference signal similar to that of FIG. 1 is assumed which is obtained by dividing the clock signal of the modulo 2N counter 403 by 2N, the virtual phase reference signal rises (i.e., has the rising edge) at the instant when the output of the modulo 2N counter 403 is reset to "0", and falls (i.e., has the falling edge) at the instant when the output of the modulo 2N counter 403 reaches N. The output of the modulo 2N counter 403 represents the phase of this virtual phase reference signal. Namely, if the output of the modulo 2N counter 403 at the time when the phase of the virtual phase reference signal is θ is represented by α(α∈{0, 1, ... , 2n−1}), then the following relation holds between θ and α:

$$\pi\alpha/N \leq \theta < \pi(\alpha+1)/N$$

Thus, the output of the modulo 2N counter 403 at each rising edge of the differential pulse signal output from the exclusive OR element 402 represents the phase of the virtual phase reference signal at the rising or the falling edge of the 2-level quantized received signal. By the way, the output of the modulo 2N counter 403 at the falling edge of the virtual phase reference signal is equal to "N". Thus, if the output of the modulo 2N counter 403 at the falling edge of the 2-level quantized received signal is corrected by numerical value "N" corresponding to the phase π, then the relative phase of the 2-level quantized received signal with respect to the virtual phase reference signal at the falling edge of the 2-level quantized received signal can be obtained. Next, this is described by reference to drawings.

Figure 6:
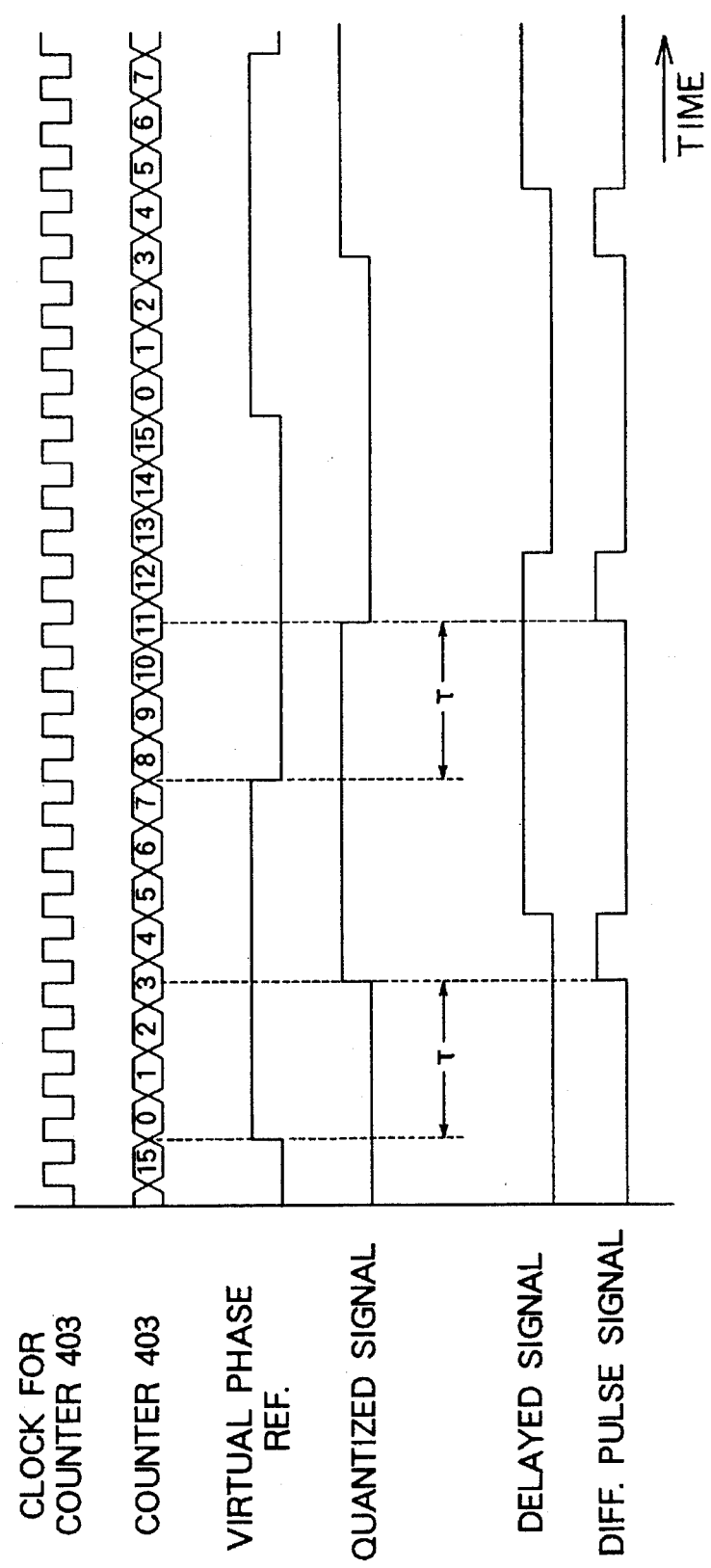
FIG. 6 is a timing chart exemplifying the waveforms of the output of the modulo 2N counter 403, the virtual phase reference signal, the 2-level quantized received signal, and the differential pulse signal of FIG. 4, in the case where N=8.

FIG. 6 is a timing chart exemplifying the waveforms of the output of the modulo 2N counter 403, the virtual phase reference signal, the 2-level quantized received signal, and the differential pulse signal of FIG. 4, in the case where N=8. From top to bottom are shown the waveforms of: the clock signal for the modulo 2N counter 403; the output of the modulo 2N counter 403; the virtual phase reference signal; the 2-level quantized received signal; the delayed received signal (output of the delay element 401); and the differential pulse signal (output of the exclusive OR element 402). The modulo 2N counter 403 counts the clock signal in modulo 2N=16.

Let the periods of the clock signal of the modulo 2N counter 403 and the virtual phase reference signal be represented by T and $T_r$, respectively. Then:

$$T_r = 2N \cdot T$$

Thus, if the time length between the rising or the falling edges of the virtual phase reference signal and the 2-level quantized received signal is represented by τ, the phase shift ψ of the 2-level quantized received signal relative to the virtual phase reference signal is given by:

$$\psi = 2\pi\tau/T_r = \pi\tau/(N \cdot T)$$

Further, let the output of the modulo 2N counter 403 at a rising edge of the 2-level quantized received signal be represented by $\beta_1$, where $\beta_1 \in \{0, 1, ..., 2N-1\}$. Then $\beta_1$ is equal to an integer obtained by first normalizing (i.e., dividing) the time τ, between the rising edges of the virtual phase reference signal and the 2-level quantized received signal, by the period T of the modulo 2N counter 403 and then discarding the fractional part of the quotient resulting from the division. Namely, the following relation holds among $\beta_1$, T and τ:

$$\beta_1 \leq \tau/T < (\beta_1+1)$$

On the other hand, the output of the modulo 2N counter 403 at the falling edge of the virtual phase reference signal is equal to "N" (=8 in the case of FIG. 14) corresponding to the phase π. Let the output of the modulo 2N counter 403 at a falling edge of the 2-level quantized received signal be represented by $\beta_2$, where $\beta_2 \in \{0, 1, ..., 2N-1\}$. Then $\beta_2$ is equal to an integer obtained by: first normalizing (i.e., dividing) the time τ between the falling edges of the virtual phase reference signal and the 2-level quantized received signal by the period T of the modulo 2N counter 403; then discarding the fractional part of the quotient resulting from the division; and finally adding numerical value "N" to the quotient. Thus, the following relation holds among $\beta_2$, T and τ:

$$(\beta_2 - N) \leq \tau/T < (\beta_2 - N + 1)$$

The subtraction in the above equation is in modulo 2N. Subtracting "N" in modulo 2N, however, is equivalent to adding "N" in modulo 2N. Thus the above equation is equivalent to:

$$(\beta_2 + N) \leq \tau/T < (\beta_2 + N + 1)$$

From the above discussion, it has been shown that the following relations hold among the output of the modulo 2N counter 403, $\beta_1$ and $\beta_2$, and the phase shift ψ of the 2-level quantized received signal:

$$\pi\beta_1/N \leq \psi < \pi(\beta_1+1)/N$$

$$\pi(\beta_2+N)/N \leq \psi < (\beta_2+N+1)/N$$

These relations show that the output $\beta_1$ of the modulo 2N counter 403 at the rising edge of the 2-level quantized received signal and the value obtained by adding numerical value "N" in modulo 2N to the output $\beta_2$ of the modulo 2N counter 403 at the falling edge of the 2-level quantized received signal can be regarded as representing the relative phase of the 2-level quantized received signal with respect to the virtual phase reference signal. In other words, the relative phase of the 2-level quantized received signal can be obtained by correcting the output of the modulo 2N counter 403, i.e., by adding the numerical value "0" at the rising edge, and the numerical value "N" at the falling edge, of the 2-level quantized received signal.

The phase inversion corrector 500 effects this correction for the output of the modulo 2N counter 403. Namely, upon receiving the output of the modulo 2N counter 403, the phase inversion corrector 500 adds to it the numerical value "0" at the rising edge, and the numerical value "N" at the falling edge, of the 2-level quantized received signal. Next, the operation of the phase inversion corrector 500 is described by reference to drawings.

Figure 7:
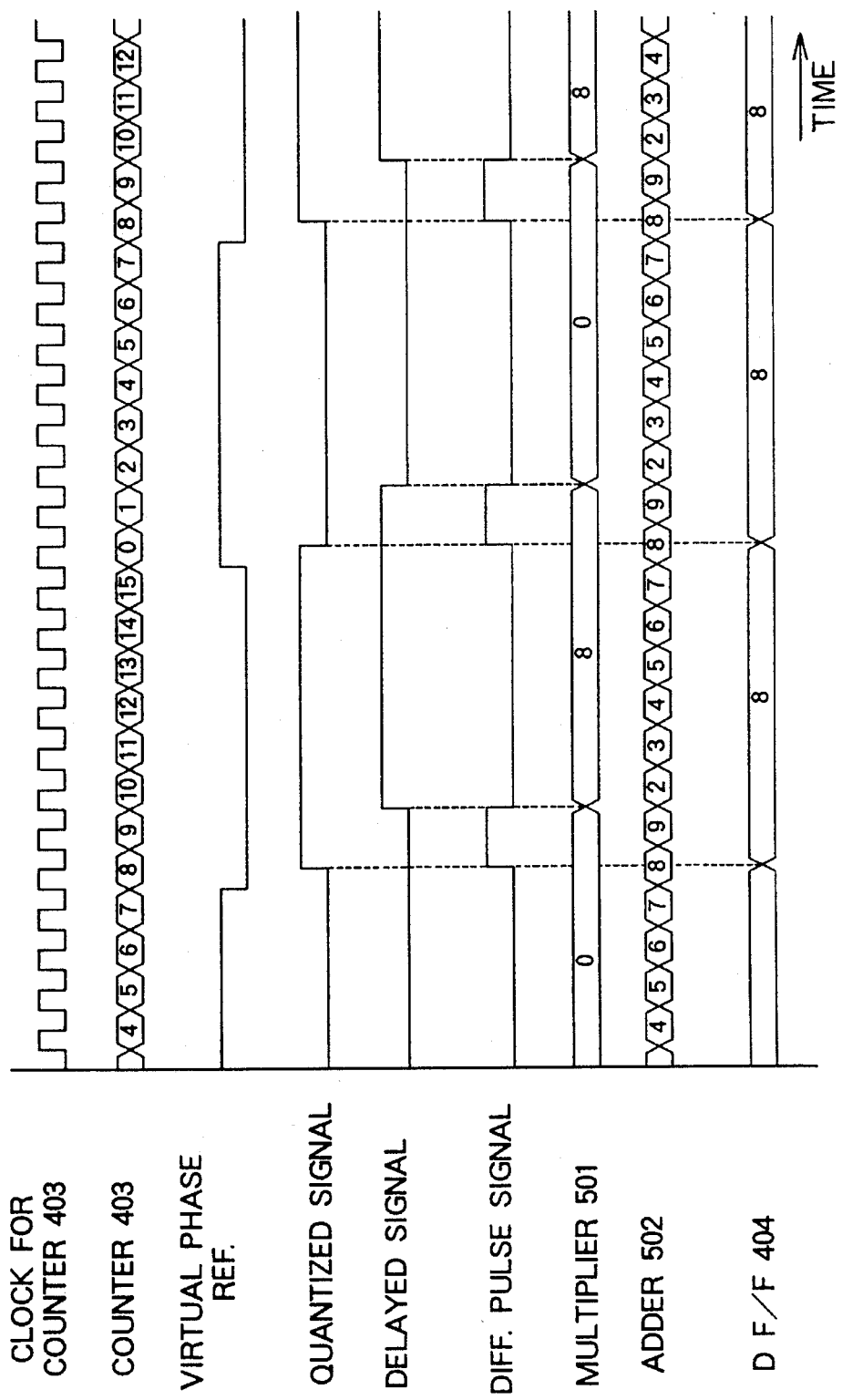
FIG. 7 is a timing chart showing the waveforms exemplifying the operation of the phase detection circuit 400 of FIG. 4, where N=8 (2N=16) and where the relative phase of the 2-level quantized received signal with respect to the virtual phase reference signal remains constant.
Figure 8:
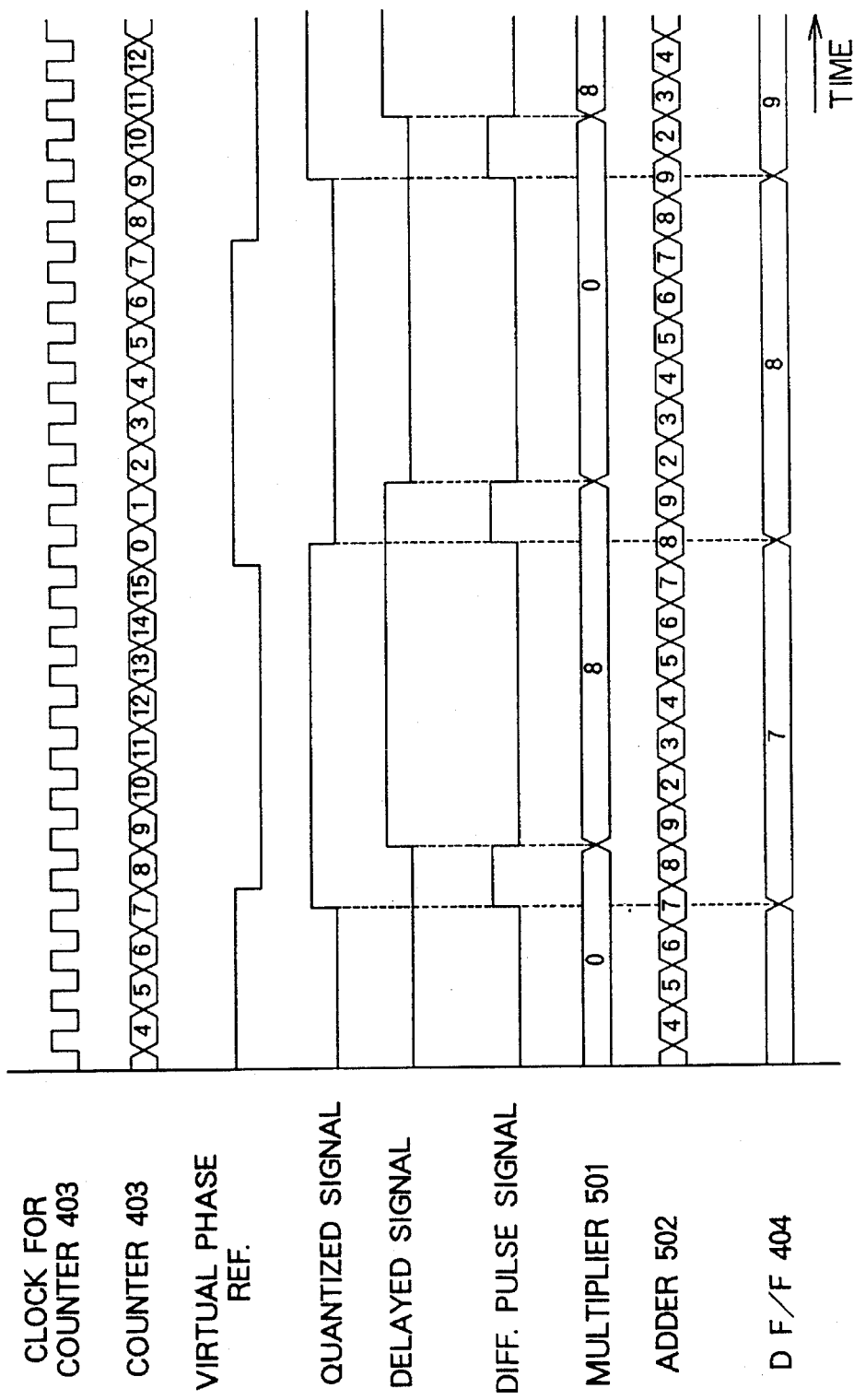
FIG. 8 is a view similar to that of FIG. 7, but showing the case where the relative phase of the 2-level quantized received signal with respect to the virtual phase reference signal is increasingly lagged.

FIG. 7 is a timing chart showing the waveforms exemplifying the operation of the phase detection circuit 400 of FIG. 4, where N=8 (2N=16) and where the relative phase of the 2-level quantized received signal with respect to the virtual phase reference signal remains constant. FIG. 8 is a view similar to that of FIG. 7, but showing the case where the relative phase of the 2-level quantized received signal with respect to the virtual phase reference signal is increasingly lagged. FIG. 9 is a view similar to that of FIG. 7, but showing the case where the relative phase of the 2-level quantized received signal with respect to the virtual phase reference signal is increasingly led. From top to bottom in the figures are shown the waveforms of: the clock signal for the modulo 2N counter 403; the output of the modulo 2N counter 403; the virtual phase reference signal; the 2-level quantized received signal; the delayed received signal (output of the delay element 401); the differential pulse signal (output of the exclusive OR element 402); the output of the multiplier 501; the output of the adder 502; and the output of the D flip-flop array 404.

As shown in these figures, the value of the delayed received signal output from the delay element 401 is at logical "0" at the rising edge, and at logical "1" at the falling edge, of the 2-level quantized received signal. The multiplier 501 multiplies output of the delay element 401 by N, thereby outputting the numerical value "0" at the rising edge, and the numerical value "N" at the falling edge, of the 2-level quantized received signal. The adder 502 adds in modulo 2N the outputs of the modulo 2N counter 403 and the multiplier 501, thereby obtaining the output of the phase inversion corrector 500. The output of the phase inversion corrector 500 is equal to the output of the modulo 2N counter 403 at the rising edge of the 2-level quantized received signal. The output of the phase inversion corrector 500 is equal to the value obtained by adding in modulo 2N the numerical value "N" to the output of the modulo 2N counter 403, at the falling edge of the 2-level quantized received signal.

The output of the phase inversion corrector 500 is supplied to the D flip-flop array 404, which is driven by the differential pulse signal output from the exclusive OR element 402. As described above, the differential pulse signal has rising edges at the rising and falling edges of the 2-level quantized received signal. Thus, the D flip-flop array 404 is driven at each rising and falling edge of the 2-level quantized received signal. Thus, if the output of the D flip-flop array 404 is represented by ρ, then μ is expressed in terms of the output values $β_1$ and $β_2$ of the modulo 2N counter 403 at the rising and the falling edges, respectively:

$$μ=β_1$$

$$μ=β_2+N$$

Thus, the following relation holds between the phase shift ψ of the 2-level quantized received signal with respect to the virtual phase reference signal and the output μ of the D flip-flop array 404:

$$πμ/N ≤ ψ < π(μ+1)/N$$

This relation shows that the output B of the D flip-flop array 404 can be regarded as representing the relative phase of the 2-level quantized received signal with respect to the virtual phase reference signal. This can be easily understood by reference to FIGS. 7 through 9.

Figure 2:
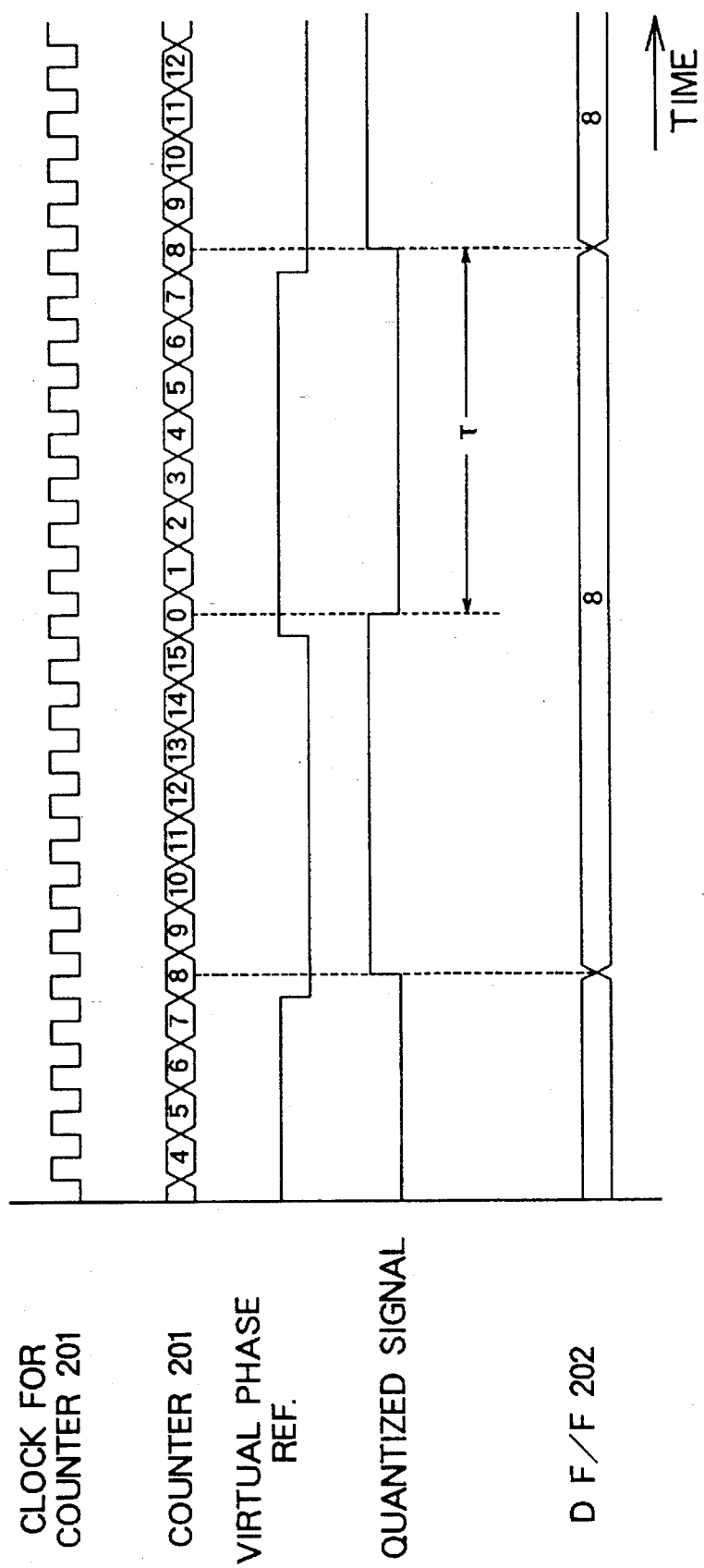
FIG. 2 is a timing chart showing waveforms exemplifying the operation of a phase detection circuit of FIG. 1 in the case where the relative phase of the received signal with respect to the virtual phase reference signal remains constant.

It is noted that in the case of the circuit of FIG. 1, the output of the D flip-flop array 202 representing the relative phase of the 2-level quantized received signal is updated only once for each period of the 2-level quantized received signal. In the case of the circuit of FIG. 12, however, the D flip-flop array 404 is driven by the differential pulse signal at the rising and the falling edges of the 2-level quantized received signal. Thus, the output of the D flip-flop array 404 representing the relative phase of the 2-level quantized received signal is updated twice for each period of the 2-level quantized received signal. The updating rate of the relative phase signal is thereby doubled. This can be easily comprehended by comparing FIG. 7 with FIG. 2 and FIGS. 8 and 9 with FIG. 3.

Figure 3:
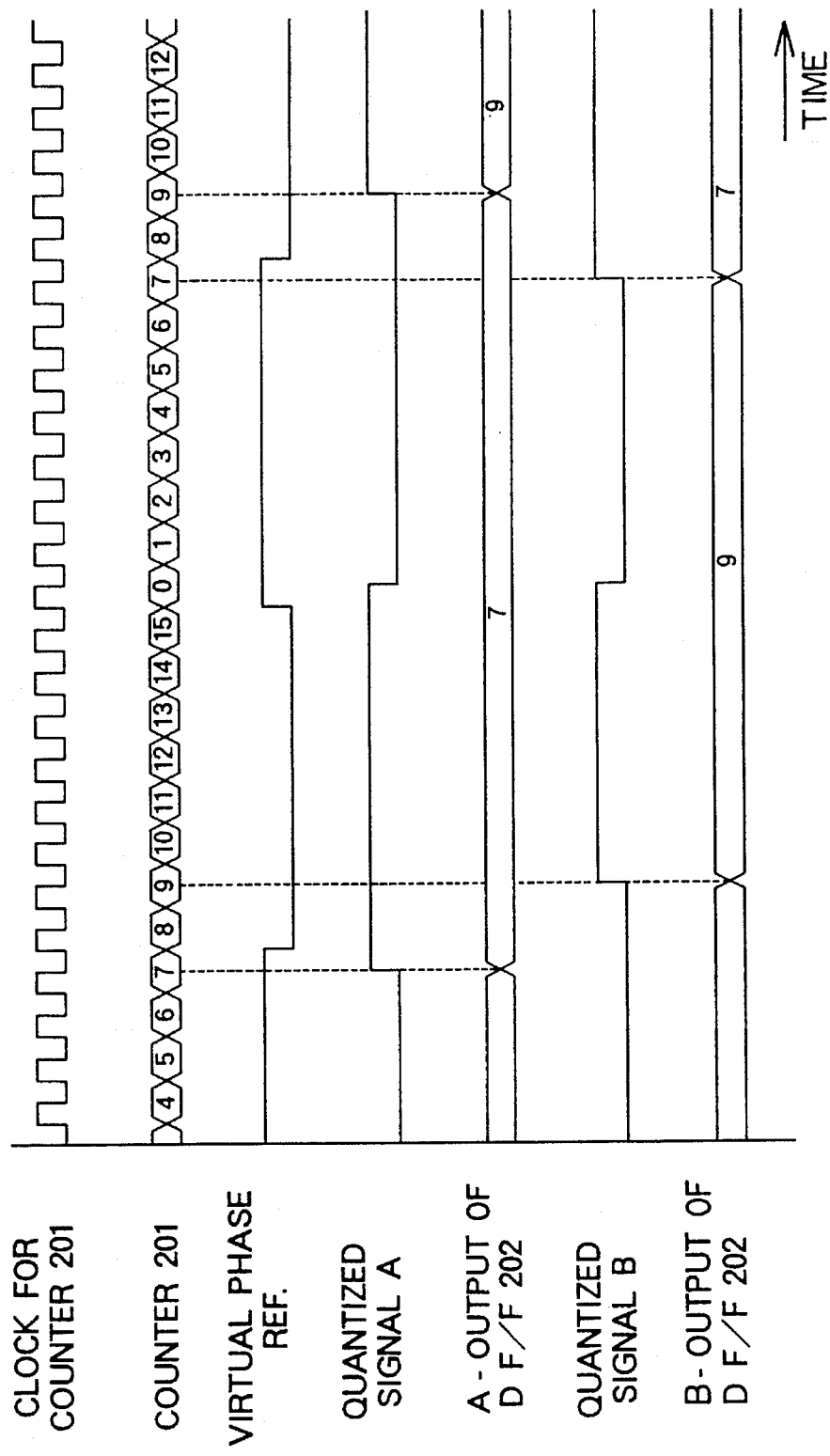
FIG. 3 is a timing chart showing waveforms exemplifying the operation of a phase detection circuit of FIG. 1, in the case where the relative phase of the received signal with respect to the virtual phase reference signal varies.

Namely, the 2-level quantized received signal A of FIG. 3 and the 2-level quantized received signal of FIG. 8 are the same. The output A of the D flip-flop array 202 in FIG. 3 varies from "7" to "9", while the output of the D flip-flop array 404 in FIG. 8 varies gradually from "7" to "8" to "9". Similarly, the 2-level quantized received signal B of FIG. 3 and the 2-level quantized received signal of FIG. 9 are the same. The output B of the D flip-flop array 202 in FIG. 3 varies from "9" to "7", while the output of the D flip-flop array 404 in FIG. 9 varies gradually from "9" to "8" to "7".

The updating rate of the relative phase signal is doubled for the circuit of FIG. 4, and hence the variation of the value of the relative phase signal is rendered less abrupt.

The operations of the delay element 40, the subtractor 41, and the decision circuit 42 are similar to those of the corresponding parts described in FIG. 9.

In FIG. 4, the phase inversion corrector 500 consists of the multiplier 501 and the adder 502. However, the element corresponding to the multiplier 501 may be implemented by any circuit which outputs numerical value "0" upon receiving numerical value "0", and numerical value "N" upon receiving numerical value "1". Such element may be implemented by a data selector which selects and outputs numerical value "0" upon receiving numerical value "0", and numerical value "N" upon receiving numerical value "1". Alternatively, the phase inversion corrector 500 may consist of logical product elements (AND gates) for effecting logical product operations (AND operations) upon the respective bits of the numerical value "N" and the output of the delay element 401.

The above description relates to the case where the received signal is modulated in accordance with the differential phase shift keying (DPSK). This invention, however, can also be applied to MSK or GMSK modulation systems. Further, in the case of the above embodiment, the constant N serving as the operation parameter of the phase detection circuit 400 is equal to 8 (N=8). However, the constant N may be any positive integer. For example, N may be N=16 or N=32.

Figure 10:
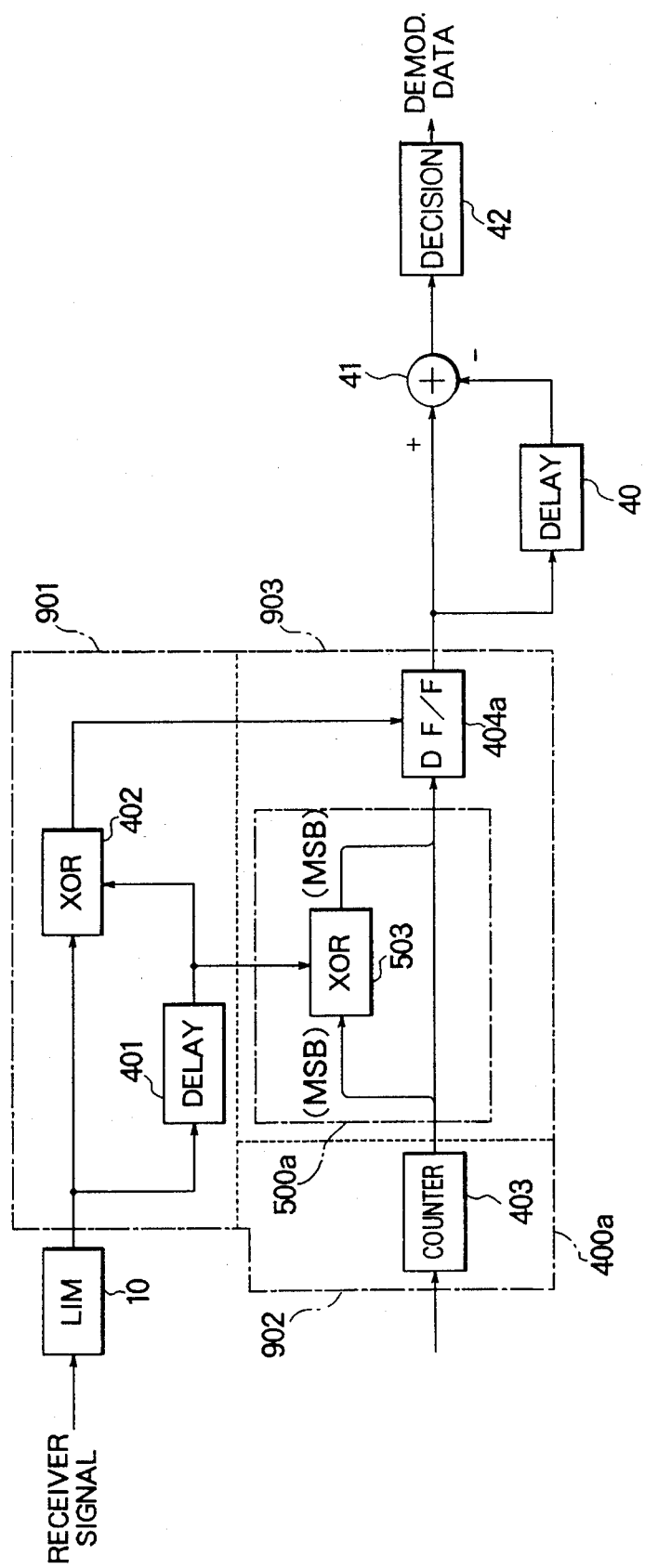
FIG. 10 is a block diagram of another differential detection demodulator provided with a phase detection circuit according to this invention, by which the value of the relative phase of the 2-level quantized received signal with respect to the virtual phase reference signal can be updated two times for each period of the 2-level quantized received signal.

FIG. 10 is a block diagram of another differential detection demodulator provided with a phase detection circuit according to this invention, by which the value of the relative phase of the 2-level quantized received signal with respect to the virtual phase reference signal can be updated two times for each period of the 2-level quantized received signal. In FIG. 10, the phase detection circuit 400a is functionally divided into: a half-period detection means 901 consisting of the delay element 401 and the exclusive OR element 402; a phase reference signal generation means 902 consisting of the modulo $2^M$ counter 403a, where M is a positive integer; and a phase shift measurement means 903 consisting of the D flip-flop array 404a and a phase inversion corrector 500a. The phase inversion corrector 500a consists of an exclusive OR element 503 having inputs coupled to the output of the delay element 401 and the most significant bit (MSB) of the output of the modulo $2^M$ counter 403a. The combination of the least significant bits (namely the first through (M−1)th bit of the modulo $2^M$ counter 403a) and the output of the exclusive OR element 503 is input to the D flip-flop array 404a. Otherwise the circuit of FIG. 10 is similar to the circuit of FIG. 4.

Next, the operation of the circuit of FIG. 10 is described in detail. In FIG. 10, the limiter amplifier 10 shapes the received signal into a rectangular waveform of a constant amplitude. Namely, the limiter amplifier 10 acts as a 2-level quantizer for subjecting the received signal to the 2-level quantization, such that the output of the limiter amplifier 10 is quantized to logical "0" and "1".

The 2-level quantized received signal output from the limiter amplifier 10 is supplied to the phase detection circuit 400a, where it is first input to the delay element 401 and the exclusive OR element 402. The delay time of the delay element 401 is shorter than the half-period of the 2-level quantized received signal. The delayed received signal output from the delay element 401 is supplied to the exclusive OR element 402. The exclusive OR element 402 effects the logical exclusive OR operation upon the outputs of the limiter amplifier 10 and the delay element 401. Thus, the output of the exclusive OR element 402 is a pulse signal (referred to as the differential pulse signal) which rises (i.e., has rising edges) at the rising and the falling edges of the 2-level quantized received signal.

The modulo $2^M$ counter 403a is driven by a clock signal having a frequency practically equal to $2^M$ times the frequency of the 2-level quantized received signal, where M is a positive integer. If a virtual phase reference signal similar to that of FIG. 1 is assumed which is obtained by dividing the clock signal of the modulo $2^M$ counter 403a by $2^M$, the virtual phase reference signal rises (i.e., has the rising edge) at the instant when the output of the modulo $2^M$ counter 403a is reset to "0", and falls (i.e., has the falling edge) at the instant when the output of the modulo $2^M$ counter 403a reaches $2^{M-1}$. The output of the modulo $2^M$ counter 403a represents the phase of this virtual phase reference signal. Namely, if the output of the modulo $2^M$ counter 403a at the time when the phase of the virtual phase reference signal is θ is represented by $\alpha (\alpha \in \{0, 1, \ldots, 2^M-1\})$, then the following relation holds between θ and α:

$$2\pi\alpha/2^M \leq \theta < 2\pi(\alpha+1)/2^M$$

Thus, the output of the modulo $2^M$ counter 403a at each rising edge of the differential pulse signal output from the exclusive OR element 402 represents the phase of the virtual phase reference signal at the rising or the falling edge of the 2-level quantized received signal. By the way, the output of the modulo $2^M$ counter 403a at the falling edge of the virtual phase reference signal is equal to "$2^{M-1}$". Thus, if the output of the modulo $2^M$ counter 403a at the falling edge of the 2-level quantized received signal is corrected by numerical value "$2^M$" corresponding to the phase π, then the relative phase of the 2-level quantized received signal with respect to the virtual phase reference signal at the falling edge of the 2-level quantized received signal can be obtained.

The phase inversion corrector 500a effects this correction for the output of the modulo $2^M$ counter 403a. Namely, upon receiving the output of the modulo $2^M$ counter 403a, the phase inversion corrector 500a adds to it the numerical value "0" at the rising edge, and the numerical value "$2^{M-1}$" at the falling edge, of the 2-level quantized received signal. Next, the operation of the phase inversion corrector 500a is described by reference to drawings.

Figure 11:
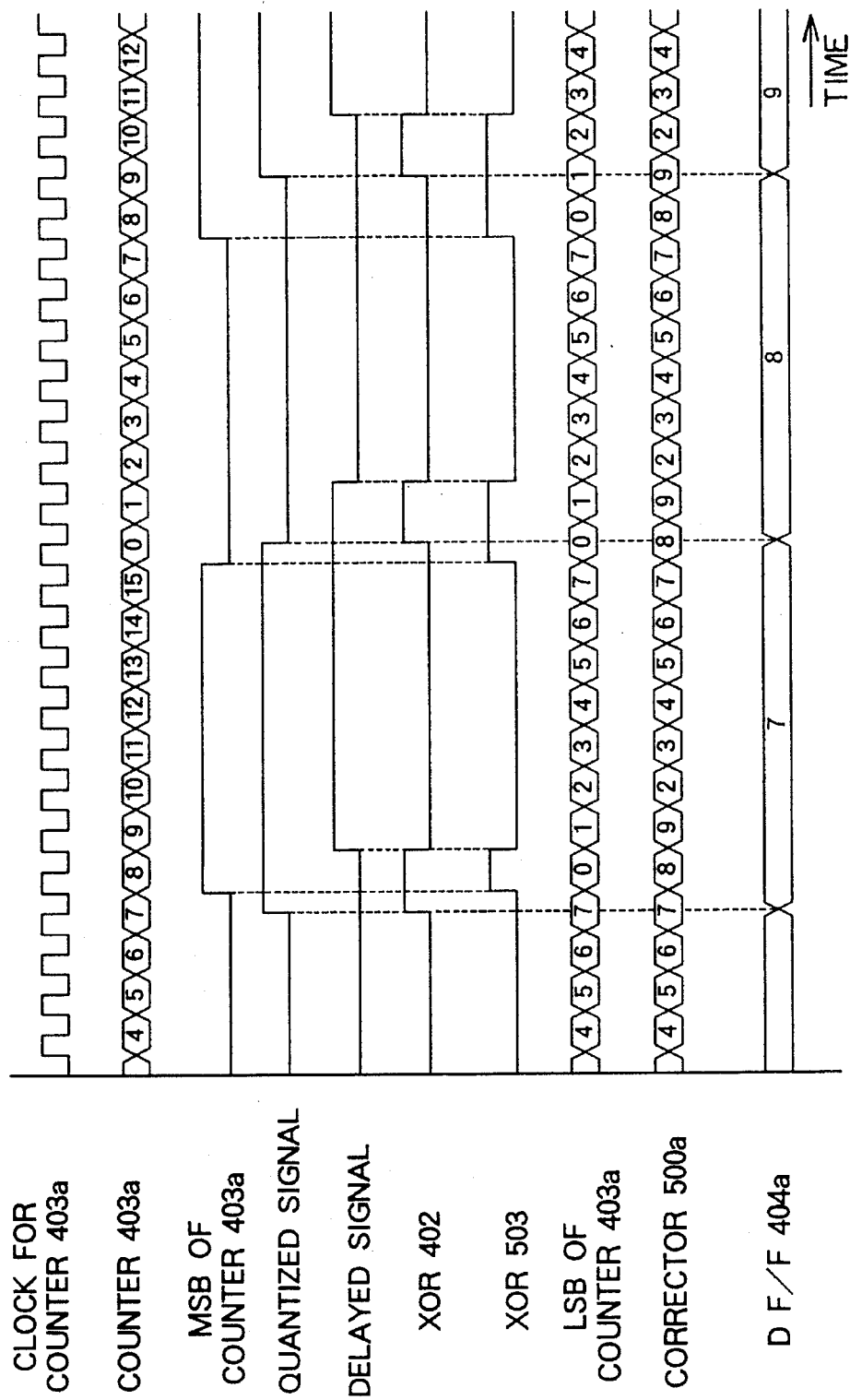
FIG. 11 is a timing chart showing the waveforms exemplifying the operation of the phase detection circuit 400a of FIG. 10, where M=4 ($2^M$=16) and where the relative phase of the 2-level quantized received signal with respect to the virtual phase reference signal remains constant.
Figure 12:
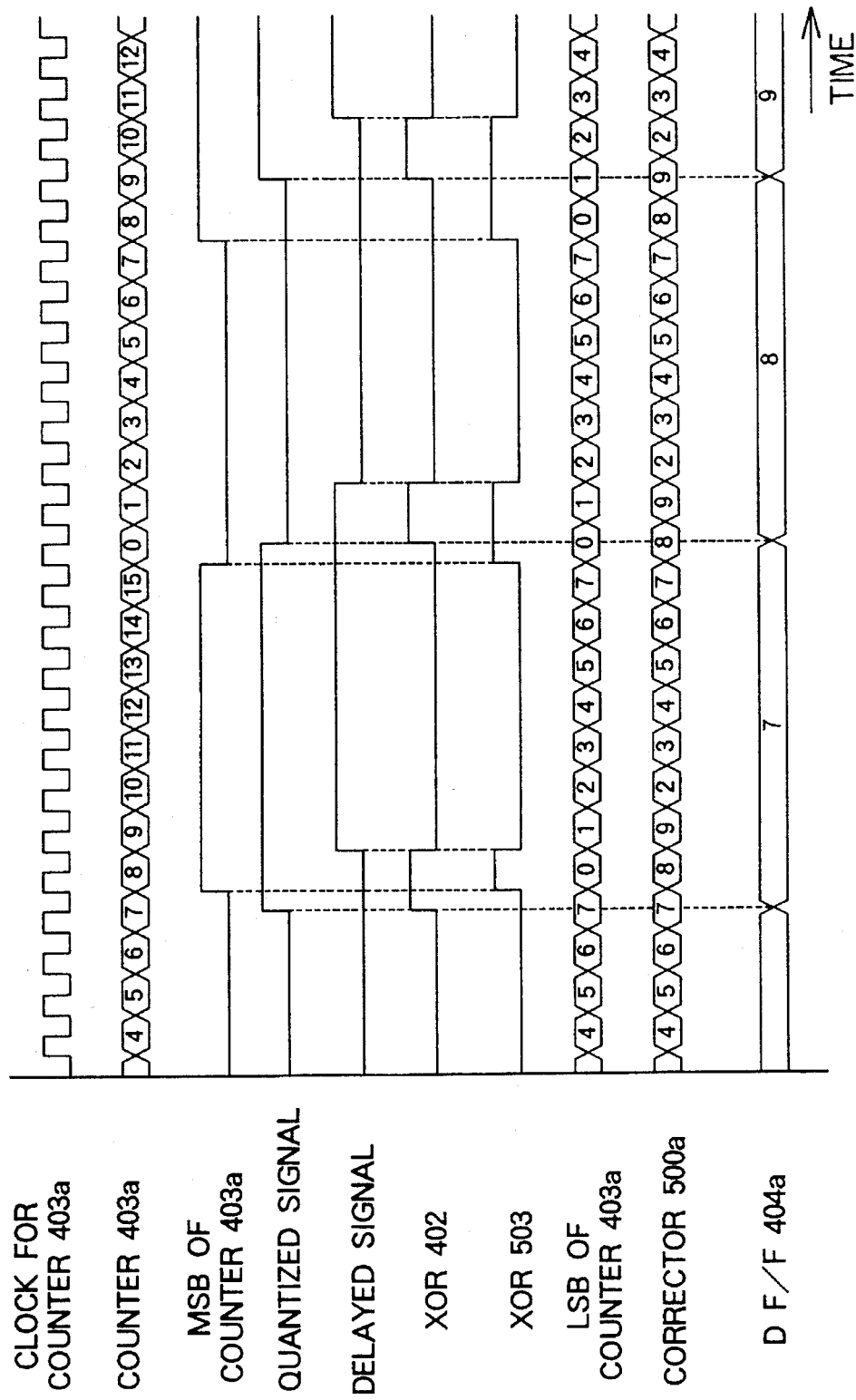
FIG. 12 is a view similar to that of FIG. 11, but showing the case where the relative phase of the 2-level quantized received signal with respect to the virtual phase reference signal is increasingly lagged.
Figure 13:
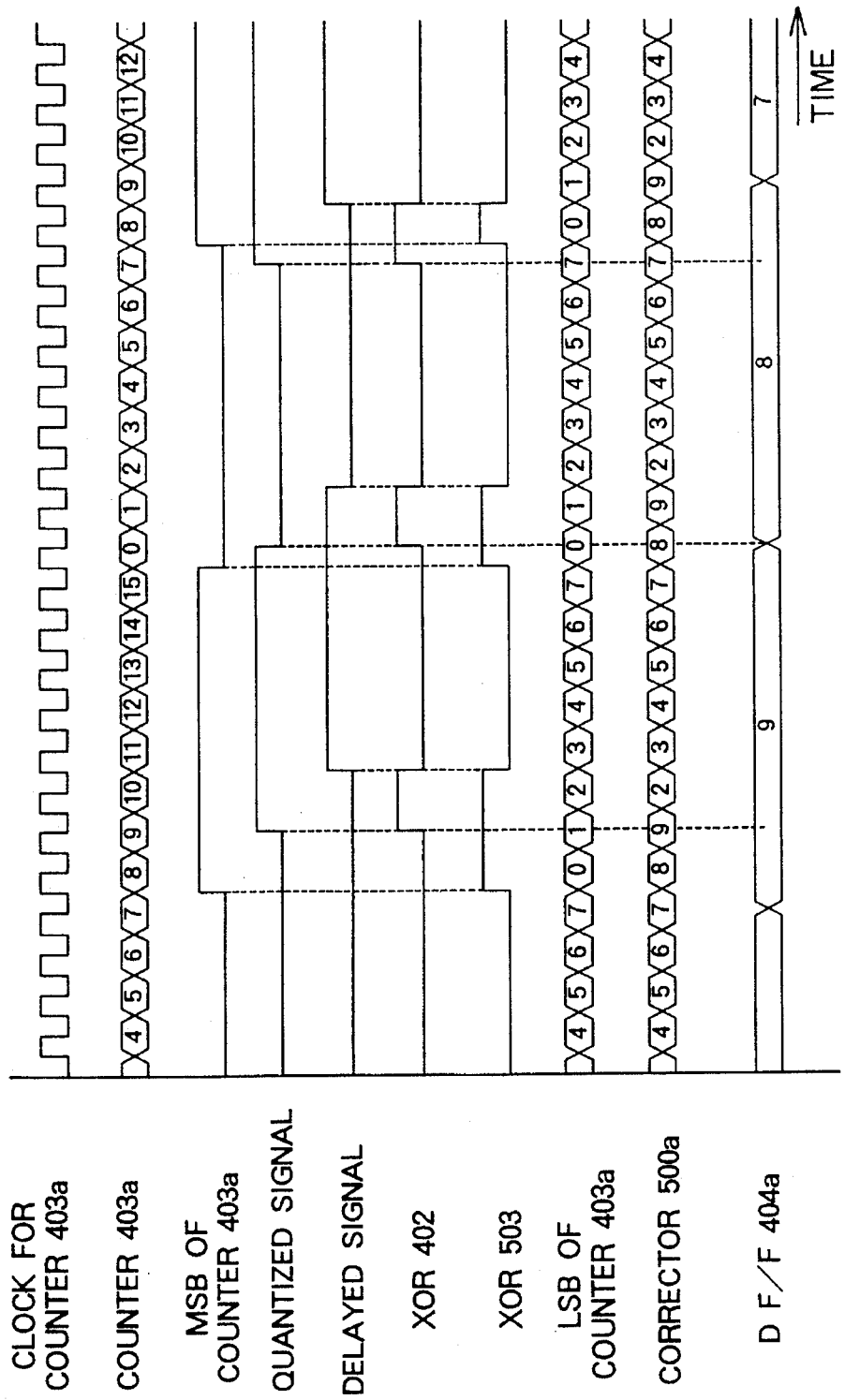
FIG. 13 is a view similar to that of FIG. 11, but showing the case where the relative phase of the 2-level quantized received signal with respect to the virtual phase reference signal is increasingly led.

FIG. 11 is a timing chart showing the waveforms exemplifying the operation of the phase detection circuit 400a of FIG. 10, where M=4 ($2^M$=16) and where the relative phase of the 2-level quantized received signal with respect to the virtual phase reference signal remains constant. FIG. 12 is a view similar to that of FIG. 11, but showing the case where the relative phase of the 2-level quantized received signal with respect to the virtual phase reference signal is increasingly lagged. FIG. 13 is a view similar to that of FIG. 11, but showing the case where the relative phase of the 2-level quantized received signal with respect to the virtual phase reference signal is increasingly led. From top to bottom in the respective figures are shown the waveforms of: the clock signal for the modulo $2^M$ counter 403a; the output of the modulo $2^M$ counter 403a; the MSB or the most significant bit (the Mth bit) of the modulo $2^M$ counter 403a (inversion of the virtual phase reference signal), the 2-level quantized received signal; the delayed received signal (output of the delay element 401); the differential pulse signal (output of the exclusive OR element 402); the output of the exclusive OR element 503; the LSBs or the least significant bits (the first through (M-1)th bits) of the modulo $2^M$ counter 403a; the output of the phase inversion corrector 500a (the combination of the least significant bits of the modulo $2^M$ counter 403a and the output of the exclusive OR element 503); and the output of the D flip-flop array 404a. The numbers at the waveforms of the modulo $2^M$ counter 403a, the least significant bits of the 403a, the phase inversion corrector 500a, and the D flip-flop array 404a represent the values thereof at respective instants.

The output of the modulo $2^M$ counter 403a consists of M bits. The most significant bit of the modulo $2^M$ counter 403a represents the numerical value "$2^{M-1}$". Thus, adding the numerical value "$2^{M-1}$" to the output of the modulo $2^M$ counter 403a in modulo $2^M$ is equivalent to logical inversion of the most significant bit of the modulo $2^M$ counter 403a. Thus, adding numerical value "0" and "$2^{M-1}$", respectively, to the output of the modulo $2^M$ counter 403a at the rising and the falling edges of the 2-level quantized received signal results in effecting no logical inversion at the rising edge, and the logical inversion at the falling edge, of the 2-level quantized received signal, upon the most significant bit of the modulo $2^M$ counter 403a.

As shown in FIGS. 11 through 13, the value of the delayed received signal output from the delay element 401 is at logical "0" at the rising edge, and at logical "1" at the falling edge, of the 2-level quantized received signal. The exclusive OR element 503 effects the logical exclusive OR operation upon the delayed received signal output from the delay element 401 and the most significant bit of the output from the modulo $2^M$ counter 403a. The output of the 503 is combined as the new most significant bit with the least significant bits (the first through (M-1)th bits) of the modulo $2^M$ counter 403a, to form the output of the phase inversion corrector 500a. Thus, the output of the phase inversion corrector 500a is equal to the output of the modulo $2^M$ counter 403a at the rising edges of the 2-level quantized received signal (no logical inversion of the most significant bit is effected). On the other hand, the output of the phase inversion corrector 500a at the falling edges of the 2-level quantized received signal consists of the logically inverted most significant bit of the modulo $2^M$ counter 403a combined with the least significant bits thereof. Thus, the output of the phase inversion corrector 500a is equal to the value obtained by adding numerical value "0" at the rising edge, and numerical value "$2^{M-1}$" at the falling edge, of the 2-level quantized received signal, to the output of the modulo $2^M$ counter 403a.

By limiting the constant 2N serving as the operation parameter in the circuit of FIG. 4 to the integer which can be expressed in the form $2^M$ the phase inversion corrector 500a can be implemented only by the exclusive OR element 503. Thus, the circuit of FIG. 10 is simplified compared to the circuit of FIG. 4.

The output of the phase inversion corrector 500a is supplied to the D flip-flop array 404a, which is driven by the differential pulse signal output from the exclusive OR element 402. As described above, the differential pulse signal has rising edges at the rising and falling edges of the 2-level quantized received signal. Thus, the D flip-flop array 404a is driven at each rising and falling edge of the 2-level quantized received signal. Thus, if the output of the D flip-flop array 404a is represented by μ, where $\mu \in \{0,1,\ldots, 2^M-1\}$, then μ is expressed in terms of the output values $\beta_1$ and $\beta_2$ ($\beta_1, \beta_2 \in \{0, 1, \ldots, 2^M-1\}$) of the modulo $2^M$ counter 403a at the rising and the falling edges, respectively:

$$\mu = \beta_1$$

$$\mu = \beta_2 + 2^{M-1}$$

Thus, the following relation holds between the phase shift ψ of the 2-level quantized received signal with respect to the virtual phase reference signal and the output p of the D flip-flop array 404a:

$$2\pi\beta/2^M \leq \psi < 2\pi(\mu+1)/2^M$$

This relation shows that the output μ of the D flip-flop array 404a can be regarded as representing the relative phase of the 2-level quantized received signal with respect to the virtual phase reference signal. This can be easily understood by reference to FIGS. 11 through 13.

As in the case of the circuit of FIG. 4, the D flip-flop array 404a of FIG. 10 is driven by the differential pulse signal at the rising and the falling edges of the 2-level quantized received signal. Thus, the output of the D flip-flop array 404a representing the relative phase of the 2-level quantized received signal is updated twice for each period of the 2-level quantized received signal. The updating rate of the relative phase signal is thereby doubled compared to the case of FIG. 1. This can be easily comprehended by comparing FIG. 11 with FIG. 2 and FIGS. 12 and 13 with FIG. 3.

Namely, the 2-level quantized received signal A of FIG. 3 and the 2-level quantized received signal of FIG. 12 are the same. The output A of the D flip-flop array 202 in FIG. 3 varies from "7" to "9", while the output of the D flip-flop array 404a in FIG. 12 varies gradually from "7" to "8" to "9". Similarly, the 2-level quantized received signal B of FIG. 3 and the 2-level quantized received signal of FIG. 13 are the same. The output B of the D flip-flop array 202 in FIG. 3 varies from "9" to "7", while the output of the D flip-flop array 404a in FIG. 13 varies gradually from "9" to "8" to "7". The updating rate of the relative phase signal is doubled for the circuit of FIG. 10, and hence the variation of the value of the relative phase signal is rendered less abrupt.

The operations of the delay element 40, the subtractor 41, and the decision circuit 42 of FIG. 10 are the same as those of the corresponding parts described in FIG. 9.

The above description relates to the case where the received signal is modulated in accordance with the differential phase shift keying (DPSK). However, the principle embodied in the circuit of FIG. 18 can be applied to MSK or GMSK modulation systems. Further, in the case of the above embodiment, the constant M serving as the operation parameter of the phase detection circuit 400a is equal to 4 (M=4). However, the constant M may be any positive integer. For example, M may be five (M=5) or six (M=6).

What is claimed is:

1. A phase detection circuit for detecting a phase shift of an input signal relative to a phase reference signal, comprising:

half-period detection means for receiving the input signal, for generating a half-period detection signal at each half-period of said input signal and for outputting the half-period detection signal;

phase reference signal generation means for generating and outputting said phase reference signal in response to a clock signal having a frequency not less than twice a frequency of said input signal; and phase shift measurement means, having an input coupled to an output of said half-period detection means and an input coupled to an output of said phase reference signal generation means including:

phase inversion correction means for receiving the phase reference signal, for correcting said phase reference signal for a phase inversion thereof at each alternate half-period of said input signal and for outputting a corrected phase reference signal; and wherein said phase shift measurement means determines a phase shift of said input signal with respect to said corrected phase reference signal at each half-period of said input signal, on the basis of said corrected phase reference signal and said half-period detection signal, and outputs a detected phase signal.

2. The phase detection circuit as claimed in claim 1, wherein:

said half-period detection means includes:

a delay element for receiving the input signal, for delaying said input signal by a delay time shorter than said half-period of said input signal and for outputting a delayed input signal; and a first exclusive OR element for receiving the input signal and the delayed input signal, for executing a logical exclusive OR of said input signal and said delayed input signal, and for outputting the half-period detection signal;

said phase reference signal generation means includes a counter for counting in modulo 2N the clock signal, wherein N is a positive integer and for outputting the phase reference signal;

said phase inversion correction means adds a numerical value, in modulo 2N, to said phase reference signal; and said phase shift measurement means further includes a D flip-flop array having an input coupled to an output of said phase inversion correction means and an input coupled to an output of said first exclusive OR element, said D flip-flop array holding the corrected phase reference signal in response to said half-period detection signal.

3. The phase detection circuit as claimed in claim 2, wherein said phase inversion correction means includes:

a multiplier having an input coupled to an output of said delay element, for multiplying said delayed input signal by N and for outputting a multiplied signal; and an adder coupled to an output of said counter and having an input coupled to an output of said multiplier, for adding the multiplied signal to said phase reference signal, in modulo 2N.

4. The phase detection circuit as claimed in claim 2, wherein said phase inversion correction means includes:

a data selector having an input coupled to and output of said delay element, for selecting a numerical value "0" when said delayed input signal is at logical "0", and a numerical value "N" when said delayed input signal is at logical "1", and for outputting the numerical value; and an adder having an input coupled To an output of said counter and an input coupled to an output of said data selector, for adding the numerical value to said phase reference signal, in modulo 2N.

5. The phase detection circuit as claimed in claim 2, wherein:

said phase inversion correction means includes a second exclusive OR element having an input coupled to an output of said delay element and an input for receiving a most significant bit of said phase reference signal, said second exclusive OR element executing a logical exclusive OR of said delayed input signal and said most significant bit and for outputting a most significant bit signal; and wherein the phase inversion correction means combines least significant bits of said phase reference signal and said most significant bit signal.

6. A method for detecting a phase shift of an input signal relative to a phase reference signal, comprising the steps of:

generating, in response to said input signal, a half-period detection signal at each half-period of said input signal;

generating said phase reference signal in response to a clock signal having a frequency not less than twice a frequency of said input signal;

correcting said phase reference signal for a phase inversion thereof at each alternate half-period of said input signal; and measuring a phase shift of said input signal with respect to said corrected phase reference signal at each half-period of said input signal and outputting a measured phase shift signal.

7. A phase detection circuit, comprising:

a half-period detection circuit having an input for receiving an input signal, which detects a half-period of the input signal, and which outputs a half-period detection signal;

a phase reference signal generator for generating and outputting the phase reference signal in response to a clock signal; and a phase shift measurement circuit having an input coupled to an output of the half-period detection circuit and a second input coupled to an output of the phase reference signal generator, which determines a phase shift of the input signal relative to the phase reference signal at each half-period of the input signal, and which outputs a detected phase signal at each half-period of the input signal.

* * * * *

UNITED STATES PATENT AND TRADEMARK OFFICE
CERTIFICATE OF CORRECTION

PATENT NO. : 5,485,108
DATED : January 16, 1996
INVENTOR(S) : Yoshiharu Kojima

It is certified that error appears in the above-indentified patent and that said Letters Patent is hereby corrected as shown below:

On the title page, Item

[30] Foreign Application Priority Data please add:
-- March 12, 1992 [JP] Japan    4-053583 -- and
-- March 25, 1992 [JP] Japan    4-067124 --

Signed and Sealed this

Sixteenth Day of July, 1996

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 5,485,108

DATED : January 16, 1996

INVENTOR(S) : Toshiharu Kojima

It is certified that error appears in the above-identified patent and that said Letters Patent is hereby corrected as shown below:

On the title page, Item

[30] Foreign Appliaction Priority Data please add:
    -- March 12, 1992 [JP] Japan   4-053583 -- and
    -- March 25, 1992 [JP] Japan   4-067124 -- .

This certificate supersedes Certificate of Correction issued July 16, 1996.

Signed and Sealed this

Twenty-second Day of October, 1996

*Attest:*

BRUCE LEHMAN

*Attesting Officer*      *Commissioner of Patents and Trademarks*